United States Patent
Hynecek

(10) Patent No.: US 9,917,120 B2
(45) Date of Patent: Mar. 13, 2018

(54) PIXELS WITH HIGH DYNAMIC RANGE AND A GLOBAL SHUTTER SCANNING MODE

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 214 days.

(21) Appl. No.: 15/136,054

(22) Filed: Apr. 22, 2016

(65) Prior Publication Data

US 2017/0134675 A1 May 11, 2017

Related U.S. Application Data

(60) Provisional application No. 62/252,767, filed on Nov. 9, 2015.

(51) Int. Cl.
   *H04N 5/378* (2011.01)
   *H01L 27/146* (2006.01)
   (Continued)

(52) U.S. Cl.
   CPC ....... *H01L 27/14612* (2013.01); *H04N 5/355* (2013.01); *H04N 5/3575* (2013.01);
   (Continued)

(58) Field of Classification Search
   CPC ........ H01L 27/14612; H01L 27/14636; H04N 5/37452; H04N 5/355; H04N 5/3575; H04N 5/378
   See application file for complete search history.

(56) References Cited

U.S. PATENT DOCUMENTS

| 5,625,210 A | 4/1997 | Lee et al. |
| 6,917,027 B2 | 7/2005 | Krymski |
| (Continued) | | |

OTHER PUBLICATIONS

Hynecek, U.S. Appl. No. 14/862,830, filed Sep. 23, 2015.
(Continued)

*Primary Examiner* — Twyler Haskins
*Assistant Examiner* — Angel L Garces-Rivera
(74) *Attorney, Agent, or Firm* — Treyz Law Group, P.C.; Joseph F. Guihan

(57) ABSTRACT

A CMOS image sensor may have back-side illuminated pixels and operate in a global shutter scanning mode. The CMOS image sensor may be implemented using three-layer chip stacking. The chip to chip electrical connections between the upper chip and the middle chip may be formed via hybrid bonding. Two bonding pads may be included in each pixel. The electrical connections between the middle chip and the lower chip may be formed at the periphery of the array. Using three-layer chip stacking with hybrid bonding allows for the transferring and storing of signals from the upper chip on the middle chip. A signal from low light level illumination and a charge overflow signal from high light level illumination may both be transferred to the middle chip. The image sensor may be able to use a global shutter scanning mode having high dynamic range.

20 Claims, 5 Drawing Sheets

(51) Int. Cl.
  *H04N 5/357* (2011.01)
  *H04N 5/355* (2011.01)
  *H04N 5/3745* (2011.01)

(52) U.S. Cl.
  CPC ......... *H04N 5/378* (2013.01); *H04N 5/37452* (2013.01); *H01L 27/14636* (2013.01)

(56) References Cited

U.S. PATENT DOCUMENTS

| | | |
|---|---|---|
| 8,773,562 B1 * | 7/2014 | Fan .................. H01L 27/14643 348/308 |
| 2002/0093034 A1 | 7/2002 | Hynecek |
| 2006/0001752 A1 | 1/2006 | Yanagisawa et al. |
| 2008/0210986 A1 | 9/2008 | Mauritzson |
| 2014/0211056 A1 | 7/2014 | Fan |
| 2015/0035028 A1 | 2/2015 | Fan et al. |
| 2015/0129943 A1 | 5/2015 | Kato et al. |

OTHER PUBLICATIONS

Yasutomi et al., "A 2.7e Temporal Noise 99.7% Shutter Efficiency 92 dB Dynamic Range Cmos Image Sensor with Dual Global Shutter Pixels." ISSCC Digest of Technical Papers (Feb. 10, 2010), pp. 398-399.
Fowler et al., "Low-noise readout using active reset for CMOS APS." Proc. SPIE 3965, Sensors and Camera Systems for Scientific, Industrial, and Digital Photography Applications, 126 (May 15, 2000).
Hong, U.S. Appl. No. 14/877,722, filed Oct. 7, 2015.
Velichko et al., U.S. Appl. No. 14/836,599, filed Aug. 26, 2015.

* cited by examiner

# PIXELS WITH HIGH DYNAMIC RANGE AND A GLOBAL SHUTTER SCANNING MODE

CROSS-REFERENCE TO RELATED APPLICATIONS

This application claims priority to U.S. Provisional Application No. 62/252767, filed on Nov. 9, 2015, entitled "Pixels with High Dynamic Range and a Global Shutter Scanning Mode," invented by Jaroslav Hynecek, and is incorporated herein by reference and priority thereto for common subject matter is hereby claimed.

BACKGROUND

This relates generally to imaging systems and, more particularly, to imaging systems with back-side illuminated pixels.

Modern electronic devices such as cellular telephones, cameras, and computers often use digital image sensors. Imager sensors (sometimes referred to as imagers) may be formed from a two-dimensional array of image sensing pixels. Each pixel includes a photosensitive element that receives incident photons (light) and converts the photons into electrical signals. Image sensors are sometimes designed to provide images to electronic devices using a Joint Photographic Experts Group (JPEG) format. Some conventional image sensors may operate in a global shutter (GS) scanning mode. However, this may require having an additional charge storage node in the pixels of the image sensor, which consumes a significant portion of the available pixel area and increases the cost of the sensors. High dynamic range (HDR) global shutter pixels may be required to store a large amount of charge, further increasing the cost of the sensors.

It would therefore be desirable to be able to provide improved pixel designs for image sensors.

DETAILED DESCRIPTION

Figure 1:
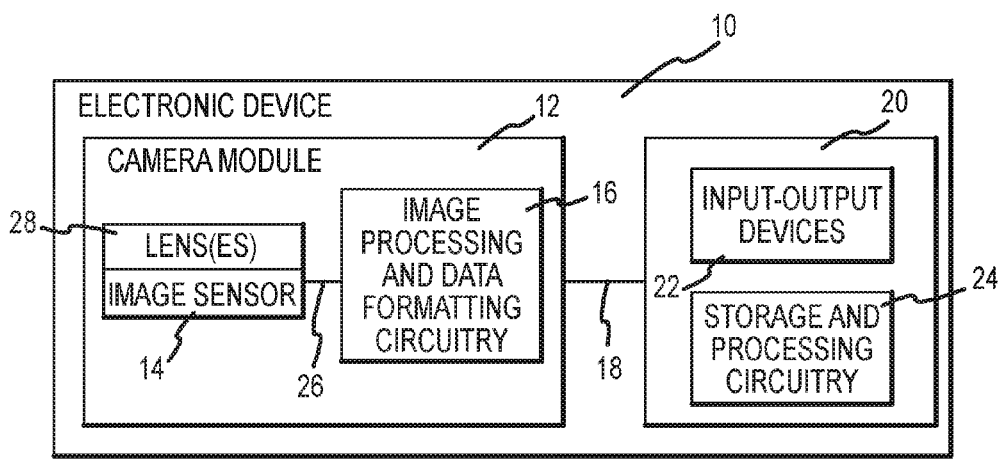
FIG. 1 is a schematic diagram of an illustrative electronic device with an image sensor in accordance with an embodiment of the present invention.

Embodiments of the present invention relate to image sensors with back-side illuminated pixels. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry signal buffering circuits (e.g., source follower and load circuits), sample and hold circuitry, correlated double sampling (CDS) circuitry, amplifier circuitry, analog-to-digital (ADC) converter circuitry, data output circuitry, memory (e.g., data buffering circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit chip. The use of a single integrated circuit chip to implement camera sensor 14 and image processing and data formatting circuitry 16 can help to reduce costs. This is, however, merely illustrative. If desired, camera sensor 14 and image processing and data formatting circuitry 16 may be implemented using separate integrated circuit chips.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
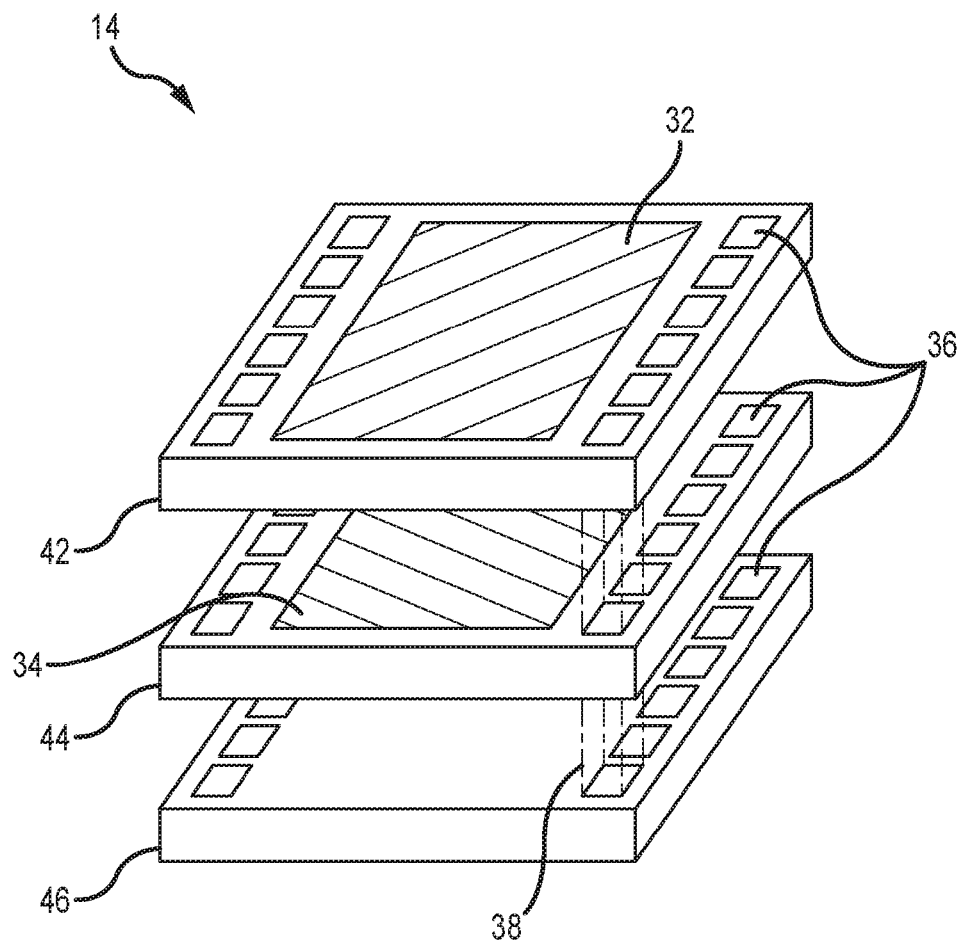
FIG. 2 is a perspective view of an image sensor with multiple substrates bonded together in accordance with an embodiment of the present invention.

FIG. 2 shows an illustrative image sensor such as image sensor 14 in FIG. 1. Image sensor 14 may sense light by converting impinging photons into electrons or holes that are integrated (collected) in sensor pixels. After completion of the integration cycle, collected charge may be converted into a voltage, which may be supplied to the output terminals of image sensor 14. In embodiments where image sensor 14 is a complementary metal-oxide semiconductor (CMOS) image sensor, the charge to voltage conversion may be accomplished directly in the pixels of the image sensor. The analog pixel voltage may then be transferred to the output terminals through various pixel addressing and scanning schemes. The analog signal may also be converted on-chip to a digital equivalent before reaching the chip output. The pixels may have a source follower (SF), which may drive the sense lines that are connected to the pixels using suitable addressing transistors.

After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node. This step removes collected charge from the floating diffusion node. However, it may generate kTC-reset noise. This kTC-reset noise may be removed from the signal using a Correlated Double Sampling (CDS) signal processing technique in order to achieve low noise performance.

Image sensor 14 may be formed with one or more substrate layers. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips. Upper chip 42 may contain the pinned photodiodes in pixel array 32. Charge transferring transistor gates may also be included in upper chip 42. However, to ensure that there is adequate room for the photodiodes in upper chip 42, much of the pixel circuitry for the pixels may be formed in middle chip 44 and lower chip 46.

Middle chip 44 may be bonded to upper chip 42 with an interconnect layer at every pixel. For example, pixel circuitry 34 in middle chip 44 may be bonded to a Floating Diffusion (FD) that is connected to a charge transfer transistor formed in upper chip 42. Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 14 may include relevant circuitry. The upper chip may contain pinned photodiodes and charge transferring transistor gates. The middle chip may include pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits.

As discussed, middle chip 44 may include floating diffusion nodes and charge sensing transistors (e.g., source follower transistors). However, this may make kTC-reset noise elimination difficult, as it may be difficult to completely reset charge transferred on this node. In the subsequent embodiments (e.g., FIGS. 3 and 4), charge may be transferred on the FD nodes that are conductively connected together between multiple chips. To read out signal from these nodes without kTC-reset noise generation, an additional circuit may be provided such as a double reset circuit or an active reset circuit.

Figure 3:
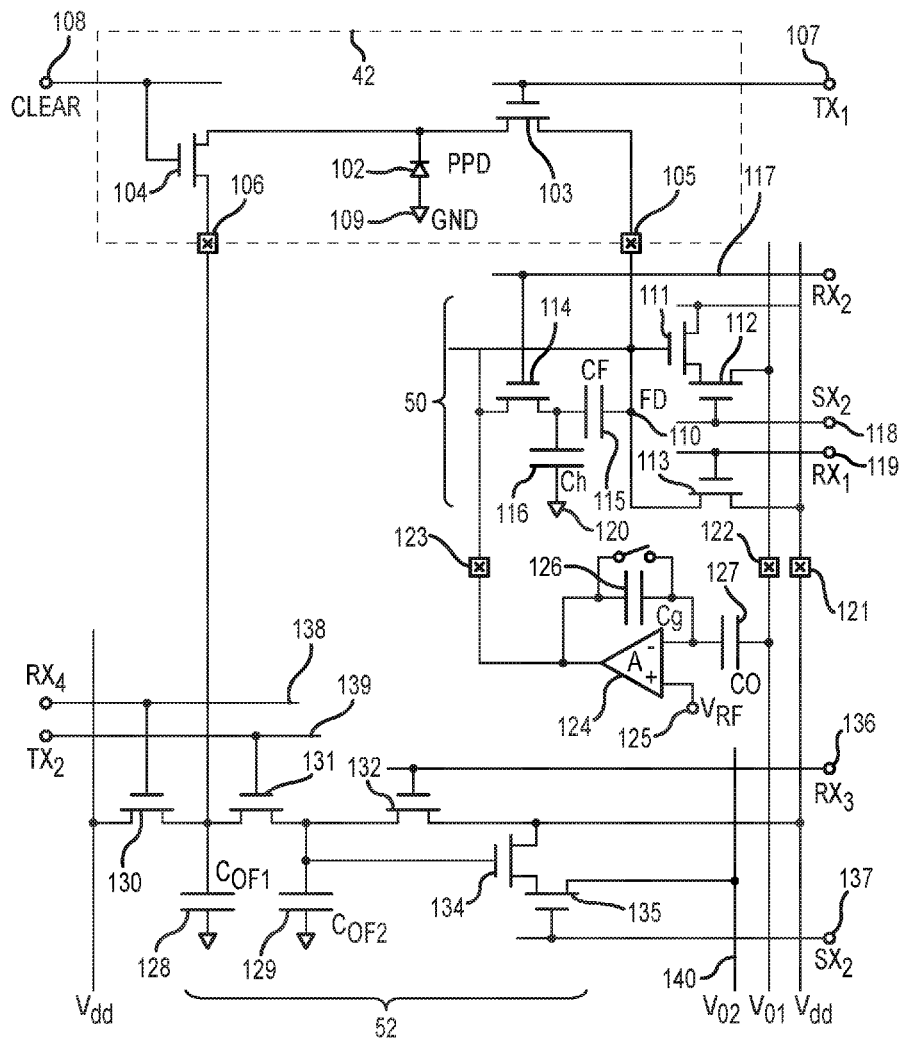
FIG. 3 is a circuit diagram of a pixel with a double reset circuit that is implemented on multiple substrates in accordance with an embodiment of the present invention.

A simplified pixel circuit diagram of a pixel with a double reset circuit is shown in FIG. 3. FIG. 3 shows the circuits located on upper chip 42 that consist of pinned photodiode (PPD) 102, low light level signal charge transfer gate 103, high light level signal charge overflow transistor 104, and chip ground contact (GND) 109. High light level signal charge overflow transistor 104 may be a buried channel transistor with various ion implants placed under its gate that contribute to high pixel to pixel threshold uniformity. The control signals to this chip may be distributed through the row lines 107 (Tx1) and 108 (CLEAR) and electrical connections to underlying middle chip 44 are made through the contacts 105 and 106, sometimes referred to as interconnect pads, metal chip-to-chip interconnect bond pads, interconnect layers or metal interconnect layers. Pinned photodiode 102 may collect photo-generated electrons and be an n-type buried diode. In these embodiments, the charge transfer gate 103 and the charge overflow transistor 104 may both be n-channel transistors. However, it is also possible to design upper chip 42 to include a p-type buried diode that collects photo-generated holes. In these embodiments, the transistors may be p-channel type. This may be advantageous in some applications, since the photodiodes for the collection of holes may have higher charge storage capacity and the FD and transistor p+ junction leakage may be partially compensated by the n+ junction leakage of the FD junction 110 on middle chip 44.

The middle chip pixel circuits may include source follower SF transistor 111 with associated row addressing transistor 112. The middle chip may also include FD reset transistor 113. To eliminate kTC-reset noise, double reset circuit 50 may be included. Double reset circuit 50 may include additional coupling capacitor $C_f$ 115 and the error voltage holding capacitor $C_h$ 116. The kTC-reset noise correcting voltage may be sensed at the pixel output. The pixel output may be delivered through the column signal line ($V_{o1}$) and chip-to chip contact 122 to the negative feedback amplifier 124 located on lower chip 46. This error voltage is amplified by the feedback amplifier 124 and delivered back to the pixel through the chip-to chip contact 123. The error voltage may then be passed through another column signal line and through the second reset transistor 114. The amplifier gain may be set by the capacitors $C_o$ 127 and $C_g$ 126. The amplifier may periodically be reset to a reference supplied to the amplifier from the reference terminal 125 ($V_{rf}$). The chip-to-chip contacts 122 and 123 from the middle chip to the bottom chip are located at the periphery of the array (as shown in FIG. 2). Power supply line contact 121 for power supply line $V_{dd}$ may also be situated at the periphery of the array.

The row control signals for the pixel circuits located on middle chip 44 may be delivered through lines 117 (Rx2), 118 (Sx1), and 119 (Rx1). The ground bias may be delivered to middle chip 44 through contact 120 using either a column or row line. After removing kTC-reset noise from a particular pixel signal, the signal may be processed by the circuits located on lower chip 46. For example, lower chip 46 may include correlated double sampling (CDS) circuits, analog to digital conversion (ADS) circuits, and other desired signal processing and amplification analog and digital circuits (e.g., digital addition circuits, DR compression circuits, etc.). The transistors located on the middle chip may be n-channel transistors or p-channel transistors. When the top chip consists of n-channel transistors, it may be advantageous for the middle chip to include p-channel transistors, since some junction leakage current compensation may occur at the FD junctions 110.

The circuits located on middle chip 44 may enable the sensor high dynamic range (HDR) operation in a global shutter (GS) mode. These circuits may include a charge overflow storing and sensing circuit 52. Charge overflow storing and sensing circuit 52 may include overflow charge integration capacitor 128 ($C_{on}$), overflow charge storage capacitor 129 ($C_{of2}$) and the associated switching/reset transistors 131 and 130. Reset transistor 130 may be coupled to a power supply line ($V_{dd}$). After the GS charge transfer has been completed for the whole array, the transistor 131 may be turned off, the transistor 130 may be reset, and the capacitor 128 may begin a new global charge integration process. The voltage appearing on the capacitors 129 may then be read out row by row by source follower (SF) transistor 134 with the corresponding row addressing transistor 135.

The capacitor 129 may then be reset by the reset transistor 132. Charge corresponding to the overflow signal may then appear on the column signal line 140 ($V_{o2}$) and may be supplied to lower chip 46 for processing. The row control signals are supplied to these circuits through the lines 136 (Rx3), 137 (Sx2), 138 (Rx4), and 139 (Tx2).

During operation, charge may be collected in pinned photodiode 102. Some of the charge (associated with low light level illumination) may be transferred to floating diffusion node 110 using low light level signal charge transfer gate 103. Other charge (associated with high light level illumination) may be transferred to charge overflow storing and sensing circuit 52 using high light level signal charge overflow transistor 104. This may enable both the low light level signal and the high light level signal to be preserved, enabling high dynamic range (HDR) operation of the pixel.

No kTC-reset noise suppression circuitry may be included for the overflow signal sensing and processing. The photon induced noise for the high light level signals stored by the overflow storage capacitors may be high enough to mask any noise generated in these circuits.

Figure 4:
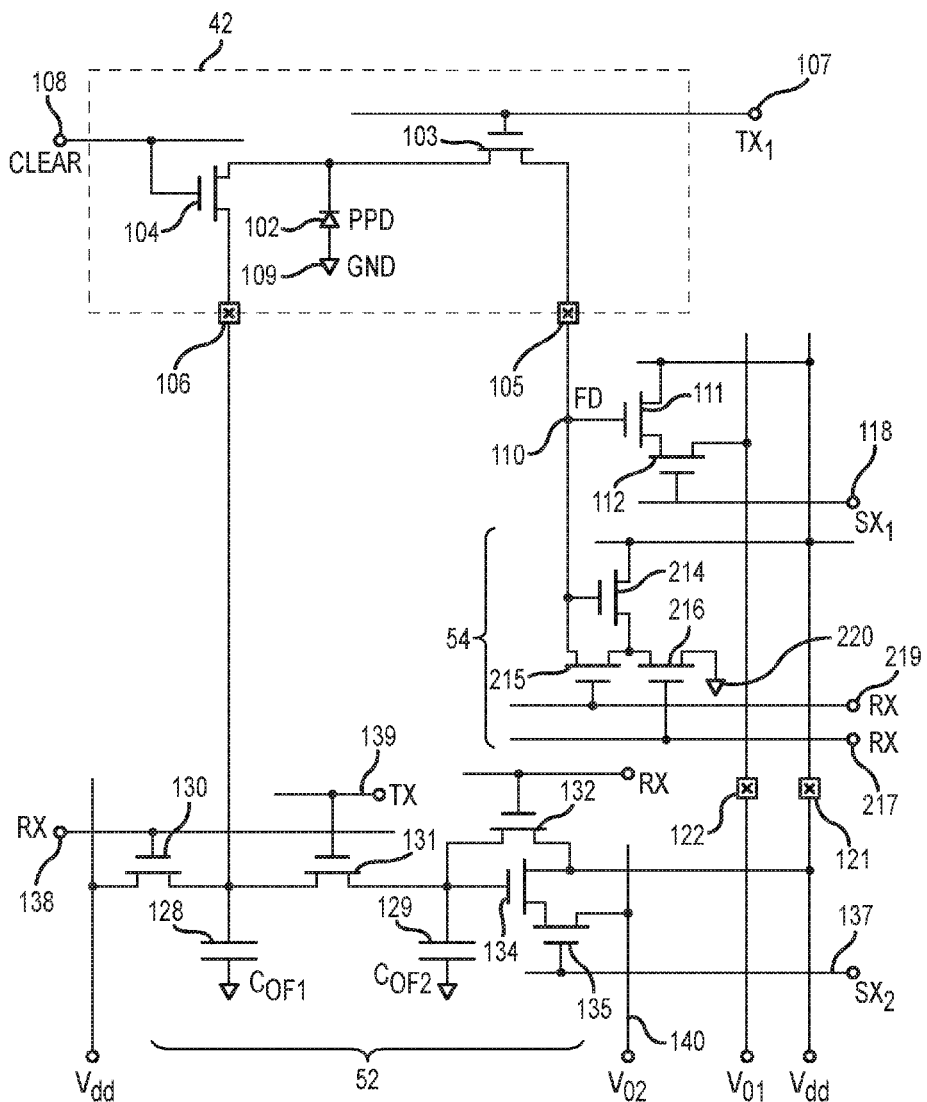
FIG. 4 is a circuit diagram of a pixel with an active reset circuit that is implemented on multiple substrates in accordance with an embodiment of the present invention.

A simplified pixel circuit diagram of a pixel with an active reset circuit is shown in FIG. 4. The pixels shown in FIG. 4 do not include column feedback amplifier 124 and its associated components from FIG. 3. Instead, FIG. 4 shows an in-pixel active reset circuit 54 that consists of p-channel transistor 214 (connected as a gain transistor), its current load n-channel transistor 216, and reset transistor 215 that can either be p-channel or n-channel. This circuit is controlled by row line 219 (Rx) for the reset and row line 217 (Rx) to turn on and off the current load of the p-channel transistor 214 when the reset of the FD node 110 has been completed. The ground for this circuit is the node 220, which may also be biased at some other slightly positive bias rather than at ground if necessary. Again, the polarity of the transistors in this circuit may be changed according to the polarity of the top chip transistors, so that the junction leakage currents generated on the FD junction nodes can partially compensate each other. The charge overflow signal processing circuit 52 may also be placed on the middle chip in this embodiment, as previously discussed in connection with FIG. 3.

Figure 5:
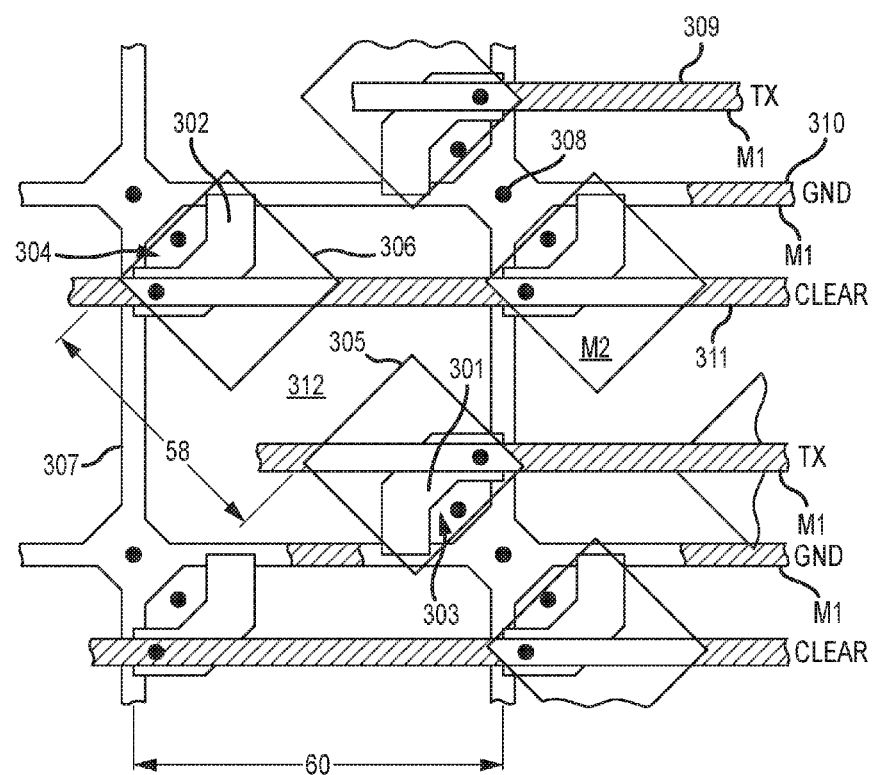
FIG. 5 is a top view of an illustrative upper substrate used in the pixel shown in FIG. 3 or 4 in accordance with an embodiment of the present invention.

A top view of the topology of upper chip 42 is shown in FIG. 5. As shown, upper chip 42 may include pixel isolation regions 307. The pixel isolation regions may be formed by ion implantation of p+ type doped impurities or n+ type doped impurities. The pixel active region, where the photon generated charge is stored, is region 312 of FIG. 5. The low light level signal from the pixel active region 312 is transferred onto the FD region 303 by applying a pulse to charge transfer gate 301. The pixel overflow charge resulting from the high light level illumination flows under the gate of the buried channel transistor 302 onto drain diffusion region 304. When it is necessary to completely reset the photodiode by removing all charge, a positive clearing pulse is applied to gate 302.

Contact vias are shown in FIG. 5 by the dark circles (e.g., contact via 308). The control lines to operate the gates are formed from a first metal level M1 (e.g., lines 309 for the transfer gates, lines 311 for the charge clearing gates, and lines 310 for applying the ground bias). A second metal level M2 may be used for forming the bond pads 305 and 306 that transfer charge from the diffusion regions to the middle layer chip circuits (e.g., bond pads 105 and 106 in FIG. 3). Each pixel thus has two hybrid bonding pads. As shown, each hybrid bonding pad may be separated from an adjacent bonding pad by a distance 58 (e.g., 2.12 μm, less than 3 μm, more than 3 μm, etc.). Each pixel may have a width 60 (e.g., 3 μm, less than μm, more than μm, etc.). The pixels shown in FIG. 5 may have a high aperture efficiency which may improve performance of image sensor 14.

The aforementioned embodiments may enable collecting and storing all charge that is generated in the pixel photodiodes (through use of the charge overflow store and sensing circuit). Charge for the low light level illuminations may be transferred onto a floating diffusion node in a middle chip, where it may be read out with low noise without kTC-reset noise generation. Overflow charge (associated with high light level illuminations) may be integrated and stored on capacitors also located on the middle chip. This enables implementation of HDR performance for a global shutter mode without sacrificing size of the photodiodes. The pixels may have large aperture efficiency, large quantum efficiency, and high resolution with HDR performance.

In various embodiments of the invention, an image sensor may include an imaging pixel. The imaging pixel may include a first substrate, a second substrate, a photodiode formed in the first substrate, first and second transfer gates formed in the first substrate, first and second charge storage regions formed in the second substrate, and first and second interconnect layers. The first interconnect layer may couple the first transfer gate to the first charge storage region, and the second interconnect layer may couple the second transfer gate to the second charge storage region. The second gate may include a charge overflow gate, and the charge overflow gate may include a buried channel transistor with ion implantations formed under the charge overflow gate. The image sensor may be configured to operate in a global shutter mode.

The photodiode may be configured to generate a total amount of charge in response to incident light. The imaging pixel may be configured to transfer a first amount of the total amount of charge to the first charge storage region using the first charge transfer gate, and the first charge storage region may be a floating diffusion node. The imaging pixel may be configured to transfer a second amount of the total amount of charge to the second charge storage region using the second charge transfer gate, and the second charge storage region may include a storage capacitor. The first and second interconnect layers may be formed on opposing sides of the imaging pixel. The image sensor may also include isolation regions that surround the imaging pixel. The isolation regions may include doped silicon. The image sensor may also include a reset transistor configured to reset the storage capacitor to a bias voltage, and a source follower transistor coupled to the storage capacitor. The image sensor may also include a source follower transistor coupled to the floating diffusion node. The source follower transistor may be formed in the second substrate. The image sensor may also include a double reset circuit formed in the second substrate that is configured to reset the floating diffusion node. The image sensor may also include a third substrate, and a column feedback amplifier formed in the third substrate. The column feedback amplifier may be coupled to the double reset circuit by a third interconnect layer. The image sensor may also include an active reset circuit formed in the second substrate that is configured to reset the floating diffusion node. The image sensor may also include a third substrate, and a correlated double sampling signal processing circuit in the third substrate.

In various embodiments, an imaging pixel may include a photodiode, a floating diffusion node, a charge storage capacitor, a first charge transfer transistor that is coupled between the photodiode and the floating diffusion node, a second charge transfer transistor that is coupled between the photodiode and the capacitor, and an active reset circuit coupled to the floating diffusion node. The imaging pixel may also include a first source follower transistor coupled to the floating diffusion node, and a second source follower transistor coupled to the charge storage capacitor. The active reset circuit may include a reset transistor coupled to the floating diffusion node, a p-channel gain transistor, and an n-channel load transistor. The active reset circuit may include a reset transistor coupled to the floating diffusion node, an n-channel gain transistor, and a p-channel load transistor. The second charge transfer transistor may be a buried channel transistor with ion implantations formed under a charge overflow gate.

In various embodiments, an imaging pixel may include a photodiode formed in a first substrate, floating diffusion nodes formed in first and second substrates, a charge storage capacitor formed in the second substrate, a first charge transfer gate that is coupled between the photodiode and the floating diffusion node, a second charge transfer gate that is coupled between the photodiode and the charge storage capacitor, and an active reset circuit coupled to the floating diffusion node. The first charge transfer transistor may be formed in the first substrate. The second charge transfer gate may be formed in the first substrate. The active reset circuit may include a gain transistor, a load transistor, and a reset transistor. The reset transistor may be coupled to the floating diffusion node. The gain transistor may have a first polarity, the load transistor may have a second polarity, and the first and second polarities may be different.

The foregoing is merely illustrative of the principles of this invention and various modifications can be made by those skilled in the art without departing from the scope and spirit of the invention.

What is claimed is:

1. An image sensor that includes an imaging pixel, wherein the imaging pixel comprises:
    a first substrate;
    a second substrate;
    a photodiode formed in the first substrate;
    first and second charge transfer gates formed in the first substrate;
    first and second charge storage regions formed in the second substrate; and
    first and second interconnect layers, wherein the first interconnect layer couples the first charge transfer gate to the first charge storage region, and wherein the second interconnect layer couples the second charge transfer gate to the second charge storage region.

2. The image sensor defined in claim 1, wherein the second gate comprises a charge overflow gate, and wherein the charge overflow gate comprises a buried channel transistor with ion implantations formed under the charge overflow gate.

3. The image sensor defined in claim 2, wherein the image sensor is configured to operate in a global shutter scanning mode.

4. The image sensor defined in claim 1, wherein the photodiode is configured to generate a total amount of charge in response to incident light, wherein the imaging pixel is configured to transfer a first amount of the total amount of charge to the first charge storage region using the first charge transfer gate, and wherein the first charge storage region is a floating diffusion node.

5. The image sensor defined in claim 4, wherein the imaging pixel is configured to transfer a second amount of the total amount of charge to the second charge storage region using the second charge transfer gate, wherein the second charge storage region comprises a charge storage capacitor.

6. The image sensor defined in claim 5, wherein the first and second interconnect layers are formed on opposing sides of the imaging pixel.

7. The image sensor defined in claim 5, further comprising isolation regions that surround the imaging pixel, wherein the isolation regions comprise doped silicon.

8. The image sensor defined in claim 5, further comprising:
    a reset transistor configured to reset the charge storage capacitor to a bias voltage; and
    a source follower transistor coupled to the charge storage capacitor.

9. The image sensor defined in claim 5, further comprising:
    a source follower transistor coupled to the floating diffusion node, wherein the source follower transistor is formed in the second substrate.

10. The image sensor defined in claim 5, further comprising:
    a double reset circuit formed in the second substrate that is configured to reset the floating diffusion node.

11. The image sensor defined in claim 10, further comprising:
    a third substrate; and
    a column feedback amplifier formed in the third substrate, wherein the column feedback amplifier is coupled to the double reset circuit by a third interconnect layer.

12. The image sensor defined in claim 5, further comprising:
    an active reset circuit formed in the second substrate that is configured to reset the floating diffusion node.

13. The image sensor defined in claim 5, further comprising:
    a third substrate; and
    a correlated double sampling signal processing circuit in the third substrate.

14. An imaging pixel comprising:
    a photodiode;
    a floating diffusion node;
    a charge storage capacitor;
    a first charge transfer transistor that is coupled between the photodiode and the floating diffusion node;
    a second charge transfer transistor that is coupled between the photodiode and the charge storage capacitor; and
    an active reset circuit coupled to the floating diffusion node.

15. The imaging pixel defined in claim 14, further comprising:
    a first source follower transistor coupled to the floating diffusion node; and
    a second source follower transistor coupled to the charge storage capacitor.

16. The imaging pixel defined in claim 14, wherein the active reset circuit comprises:
    a reset transistor coupled to the floating diffusion node;
    a p-channel gain transistor; and an n-channel load transistor.

17. The imaging pixel defined in claim 14, wherein the active reset circuit comprises:
   a reset transistor coupled to the floating diffusion node;
   an n-channel gain transistor; and
   a p-channel load transistor.

18. The imaging pixel defined in claim 14, wherein the second charge transfer transistor is a buried channel transistor with ion implantations formed under a charge overflow gate.

19. An imaging pixel comprising:
   a photodiode formed in a first substrate;
   a floating diffusion node formed in a second substrate;
   a charge storage capacitor formed in the second substrate;
   a first charge transfer gate that is coupled between the photodiode and the floating diffusion node, wherein the first charge transfer gate is formed in the first substrate;
   a second charge transfer gate that is coupled between the photodiode and the charge storage capacitor, wherein the second charge transfer gate is formed in the first substrate; and
   an active reset circuit coupled to the floating diffusion node, wherein the active reset circuit comprises a gain transistor, a load transistor, and a reset transistor, and wherein the reset transistor is coupled to the floating diffusion node.

20. The imaging pixel defined in claim 19, wherein the gain transistor has a first polarity, wherein the load transistor has a second polarity, and wherein the first and second polarities are different.

* * * * *